(12) United States Patent
Eklund

(10) Patent No.: US 6,346,844 B1
(45) Date of Patent: Feb. 12, 2002

(54) COUPLING FOR ACTIVE SEMI-CONDUCTOR COMPONENTS

(76) Inventor: Klas-Hakan Eklund, Manhemsvagen 20 B S-191 43, Sollentuna (SE)

( * ) Notice: Subject to any disclaimer, the term of this patent is extended or adjusted under 35 U.S.C. 154(b) by 0 days.

(21) Appl. No.: 09/786,156

(22) PCT Filed: Aug. 31, 1999

(86) PCT No.: PCT/SE99/01497

§ 371 Date: Apr. 25, 2001

§ 102(e) Date: Apr. 25, 2001

(87) PCT Pub. No.: WO00/13299

PCT Pub. Date: Mar. 9, 2000

(30) Foreign Application Priority Data

Sep. 1, 1998 (SE) .............................................. 9802942

(51) Int. Cl.⁷ .......................................... H03K 17/687
(52) U.S. Cl. ..................................................... 327/436
(58) Field of Search ............................... 327/427, 434, 327/436, 437, 581, 594, 595, 401, 389, 391

(56) References Cited

U.S. PATENT DOCUMENTS

| 4,394,590 | A | | 7/1983 | Honda ......................... 327/436 |
| 4,459,498 | A | | 7/1984 | Stengl et al. ................ 327/502 |
| 4,487,458 | A | * | 12/1984 | Janutka ....................... 327/436 |
| 4,491,750 | A | * | 1/1985 | Janutka ....................... 327/436 |
| 4,692,643 | A | | 9/1987 | Tokunaga et al. ............ 327/436 |
| 4,751,408 | A | * | 6/1988 | Rambert ...................... 327/436 |
| 5,148,064 | A | * | 9/1992 | Kevorkian et al. ......... 327/436 |

* cited by examiner

*Primary Examiner*—My-Trang Nu Ton
(74) *Attorney, Agent, or Firm*—Young & Thompson

(57) ABSTRACT

The invention relates to a method of coupling active semi-conductor components, and to such a coupling, and particularly to a series-coupling of such components to enable high voltages to be controlled. According to the invention, a voltage ($V_{s2}, V_{s3}, V_{s3} \ldots V_{sn}$) is taken from a semiconductor component ($T_1, T_2, T_3, T_4 \ldots T_{n-1}$) and applied to a controlling input of the next following semiconductor component ($T_2, T_3, T_4 \ldots T_{n-1}$) said voltage being locked at a predetermined highest value.

10 Claims, 2 Drawing Sheets

COUPLING FOR ACTIVE SEMI-CONDUCTOR COMPONENTS

BACKGROUND OF THE INVENTION

The present invention relates to A method of coupling active semiconductor components and also to such a coupling and then particularly to a series-connection of such couplings that will enable high voltages to be controlled.

Hitherto, a large number of components have been required in order, to control high voltages by connecting together semiconductor components in series, wherewith a pair of additional transistors resistances and—diodes are normally required in addition to the "actually" active transistor, which makes the couplings expensive. An example of one such known coupling is illustrated in FIG. 1, which shows a series-connection of two MOS-based power transistors that are coupled to control a voltage of some kV. This earlier known coupling is illustrated and described in the book "POWER MOSFETS Theory and Applications" by Duncan A. Grant and John Gowar, published by John Wiley. & Sons. In a known application, it has previously only been found practical to apply across a transistor a voltage of at most 2000 V. It will be apparent that in order to be able to control still higher voltages while Using the same principles, the coupling will become even more extensive and comprehensive with further components needing to be connected in series.

In the power distribution field for instance, it is necessary to be able to control voltages of up to 100,000 V or still higher, while voltages of up to about 25,000 V are handled in respect of railroad and trolley car traffic for instance.

SUMMARY OF THE INVENTION

Accordingly, an object of the present invention is to provide a method which will enable active semiconductor components to be connected in series without complicated and expensive peripheral coupling so as to enable high voltages to be controlled at low cost.

These objects are achieved in accordance with the invention by taking a voltage from semiconductor component and applying this voltage to the control input of the next following semiconductor component and locking said voltage at a predetermined highest level.

According to one preferred embodiment of the invention, the semiconductor component is a transistor that includes floating metal-contacted protective rings and said voltage is taken from one of these protective rings.

A typical method, of terminating a high voltage semiconductor component is to use the aforesaid floating metal-contacted protective rings. The principle construction of the outer part of such a transistor is shown in FIG. 2, which also shows the depletion area of a transistor in the form of a curve and the active part is shown on the left. When the voltage across the active part of the transistor increases, the depletion area will reach the first protective ring at a voltage $V_1$, and this ring will then adopt the voltage $V_1$. At the voltage $V_2$, the depletion area will have reached the second protective ring, which then adopts the voltage $V_2$, and so on. One of the last protective rings has the potential $V_f$, this potential being utilised in the invention as described hereinafter in more detail.

BRIEF DESCRIPTION OF THE DRAWINGS

The invention will now be described with reference to a non-limiting embodiment thereof and also with reference to the accompanying drawings, in which.

DESCRIPTION OF THE PREFERRED EMBODIMENT

Figure 1:
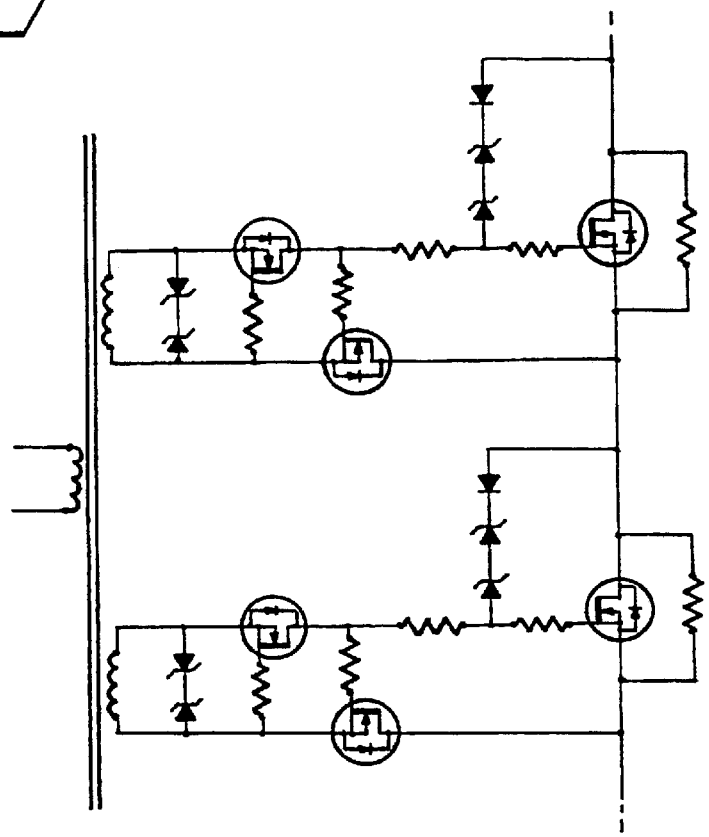
FIG. 1 illustrates an example of an earlier known coupling.
Figure 2:
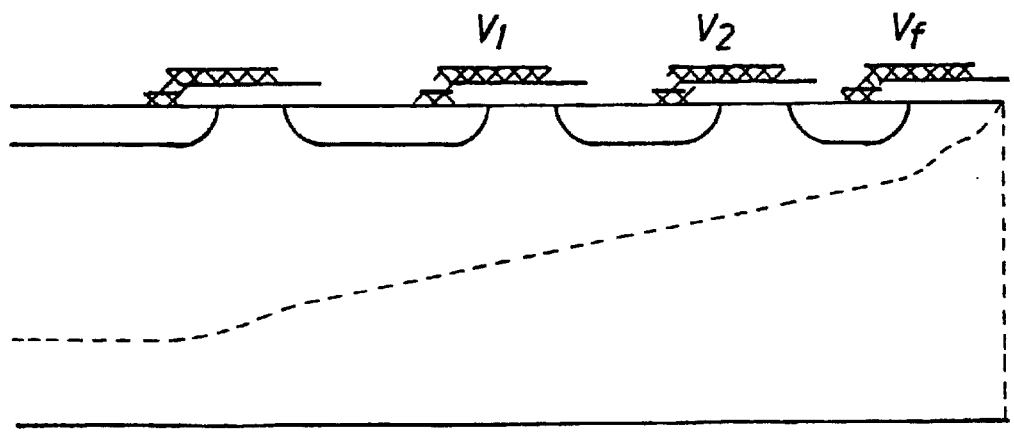
FIG. 2 illustrates the .principle construction of the outer part of a transistor.
Figure 3:
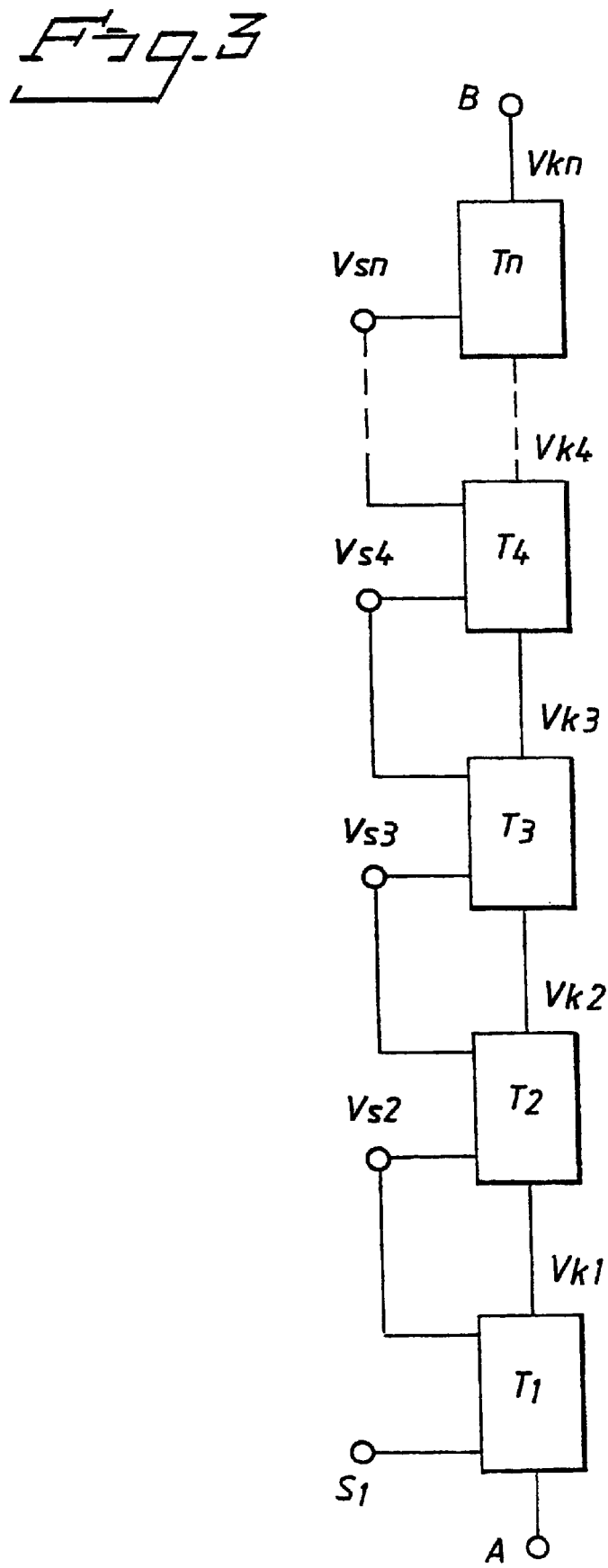
FIG. 3 illustrates an inventive coupling.

FIG. 3 thus illustrates an exemplifying embodiment of an inventive coupling, more particularly a schematic illustration of a number of series-connected transistors $T_1$, $T_2$, $T_3$, $T_4 \ldots T_n$. The letter A designates the reference point for the voltage across the circuit, normally earth, while letter B designates the voltage connection at the other end of the series-connected circuit.

In the case of an inventive transistor series-connection all of the transistors will preferably be of the depletion kind with the exception of the first transistor $T_1$. In other words, the transistor is normally on with a 0 V on the gate in relation to the emitter and is normally off with a negative voltage on the gate that is greater than the threshold value $V_t$ figure-wise. The first transistor $T_1$ in the coupling may either be of the depletion kind or of the enhancement kind. This latter type of transistor is the most usual, since the transistor is then normally off and can be controlled with a +5 V logic signal on the gate $S_1$. The voltage on the gate of the second transistor $V_{s2}$ is given by a voltage taken from the first transistor and follows the collector voltage $V_{k1}$ on this transistor. When the voltage $V_{k1}$ reaches a value $V_f$, the gate of the second transistor is locked at this value. When $V_{k1}$ then increases, the second transistor will be switched-off when $V_{k1}-V_f$ is greater than $V_t$, the threshold voltage of the depletion transistor. The voltage across the second transistor $T_2$ will then increases which, in turn, will switch-off the third transistor $T_3$. This chain reaction then takes place in a corresponding manner throughout the entire series-coupling circuit down to the last transistor $T_n$.

There is obtained from the output, the collector, of each transistor $T_1$, $T_2$, $T_3$, $T_4 \ldots T_n$ a collector voltage $V_{k1}$, $V_{k2}$, $V_{k3}$, $V_{k4} \ldots V_{kn}$, where $V_{kn}$ is equal to the output voltage across the series-coupled circuit. A control voltage can be applied to the gate of respective transistors. An external voltage $S_1$ can be applied to the first transistor in the circuit, $T_1$, and a voltage $V_{s2}$, $V_{s3}$, $V_{s4} \ldots V_{sn}$ can be applied to the gate of the remaining transistors $T_2$, $T_3$, $T_4 \ldots T_n$.

The novelty of the present invention lies essentially in taking a voltage $V_{s2}$, $V_{s3}$, , $V_{s4} \ldots V_{sn}$ from a respective preceding transistor $T_1$, $T_2$, $T_3$, $T_4 \ldots T_{n-1}$ and applying this voltage to the gate of the respective following transistor $T_2$, $T_3$, $T_4 \ldots T_n$. According to a preferred embodiment of the invention, this is effected by connecting one of the last protective rings having the potential $V_f$ in respective transistors to the gate of the next following transistor by an external connection, this transistor being switched-off when the voltage has increased to $V_f+V_t$. The voltage is therewith built-up incrementally across the series-coupled transistors. The external connection can be effected by connecting a bonding wire between the protective ring concerned in a transistor and the gate of the following transistor. Such a bonding wire may alternatively be connected indirectly, e.g. via a circuit board, between the relevant protective ring of a transistor and the gate of the following transistor. Because the ring voltage of the protective ring is in dependent of the collector voltage, regardless of the extent to which this latter voltage increases, there is obtained a constant voltage $V_s$ that can be applied to the gate of the following transistor.

A resistance may be connected in series with the bonding wire, in order to avoid the risk of self-oscillation of the system.

The invention provides a simple method of coupling semiconductor components in series for high voltage purposes, and enables the components to be switched very rapidly from an active to an inactive state, and vice versa. The inventive coupling method can be used for all types of semiconductors that have at least three terminals.

What is claimed is:

1. A method of coupling in series active semiconductor components that have at least three terminals, characterised by taking a voltage ($V_{s2}$, $V_{s3}$, $V_{s4}$ ... $V_{sn}$) from a semiconductor component ($T_1$, $T_2$, $T_3$, $T_4$ ... $T_{n-1}$) and directly applying said voltage to a controlling input of the next following semiconductor component ($T_2$, $T_3$, $T_4$ ... $T_n$) and locking said voltage at a predetermined highest value.

2. A method according to claim 1, characterised by taking said voltage $V_{s2}$, $V_{s3}$, $V_{s4}$ ... $V_{sn}$) from a protective ring of the semiconductor component ($T_1$, $T_2$, $T_3$, $T_4$ ... $T_{n-1}$).

3. A method according to claim 2, characterised by connecting the protective ring of the semiconductor component ($T_1$, $T_2$, $T_3$, $T_4$ ... $T_{n-1}$) by means of a connection to the controlling input of the next following semiconductor component ($T_2$, $T_3$, $T_4$ ... $T_n$).

4. A method according to claim 3 characterised in that said connection is a bonding wire that is connected directly to the controlling input of the next following semiconductor component ($T_2$, $T_3$, $T_4$ ... $t_n$).

5. A method according to claim 4, characterised by coupling a resistance in series with the bonding wire.

6. A coupling for series-coupling active semiconductor components that have at least three terminals, characterised in that a controlling input of a next following semiconductor component ($T_2$, $T_3$, $T_4$ ... $T_n$) is directly connected for the application of a voltage ($V_{s2}$, $V_{s3}$, $V_{s4}$ ... $V_{sn}$) taken from a preceding semiconductor component ($T_1$, $T_2$, $T_3$, $T_4$ ... $t_{n-1}$), said voltage being locked at a predetermined highest value.

7. A coupling according to claim 6, characterised in that the voltage ($V_{s2}$, $V_{s3}$, $V_{s4}$ ... $V_{sn}$) is taken from a protective ring of the preceding semiconductor component ($T_1$, $T_2$, $T_3$, $T_4$ ... $T_{n-1}$).

8. A coupling according to claim 7, characterised in that the protective ring of the preceding semiconductor component ($T_1$, $T_2$, $T_3$, $T_4$ ... $T_{n-1}$) is. connected to the controlling input of the next following semiconductor component ($T_2$, $T_3$, $T_4$ ... $T_n$).

9. A coupling according to claim 8, characterised in that said connection is a bonding wire which is directly connected to the controlling input of the next following semiconductor component ($T_2$, $T_3$, $T_4$ ... $T_n$).

10. A coupling according to claim 9, characterised in that a resistance is coupled in series with the bonding wire.

* * * * *